$r_D$ = 250 ohms $C_{in} \sim$ 50 pf $g_m$ = 2000 $\mu$ mhos $R_{in} >$ 100 megohms $\mu$ = 500 GB $\sim$ 6.4 MC $A_v = \dfrac{\mu R_L}{r_D + R_L} \approx g_m R_L$

INVENTOR
CHARLES E. GANE

BY

ATTORNEY

United States Patent Office 3,449,683
Patented June 10, 1969

3,449,683

OPERATIONAL THIN FILM AMPLIFIER

Charles E. Gane, Annandale, Va., assignor, by mesne assignments, to the United States of America as represented by the Secretary of the Navy Filed Apr. 26, 1967, Ser. No. 634,812
Int. Cl. H03f 3/04, 3/16, 3/14
U.S. Cl. 330—21 7 Claims

ABSTRACT OF THE DISCLOSURE

There is disclosed a monotronic amplifier utilizing two thin film field effect transistors connected in modified cascode relationship. A low frequency filter is connected to the input of the amplifier and a high frequency filter is connected to the output. An appropriate feedback means provides a negative feedback. This amplifier can then be cascaded with other similar amplifiers to form a high gain A.C. monotronic operational amplifier.

*Background of the invention*

The present invention relates to thin film transistor circuits and has particular, but not exclusive reference to thin film transistor multi-stage feedback amplifiers. In the amplifier field it has been the general practice to employ field effect transistors in various configurations in order to produce an operational amplifier. Although such devices have served the purpose, they have not proved entirely satisfactory under all conditions of service for the reason that considerable difficulty has been experienced in producing an amplifier which is small in size, which gives a high gain output and which provides temperature stability over a wide range of temperatures.

*Summary*

The general purpose of this invention is to provide a monotronic operational amplifier which embraces all the advantages of similarly employed amplifiers and possesses none of the aforedescribed disadvantages. To attain this, the present invention utilizes a unique arrangement of components forming an amplification stage. The single stage consists of two thin film field effect transistors connected in a modified cascode connection with appropriate biasing networks. A novel low frequency filter is connected to the input of the stage and a unique high frequency filter is placed on the output of the stage. A negative feedback path is then provided from the output of the stage to the input thereof. Further, odd numbers of stages are then able to be cascaded to form a high gain operational monotronic amplifier. The resulting amplifier is small in size and yields temperature stability over a wide range of temperatures.

It is therefore an object of the present invention to provide a monotronic amplifier stage possessing temperature stability.

Another object is to provide a frequency stable monotronic amplifier.

A further object of the invention is the provision of a monotronic amplifier stage that can be cascaded to form a high gain operational thin film amplifier.

Still another object is to provide a monotronic amplifier providing stability at high frequencies.

Yet another object of the present invention is the provision of a high gain monotronic amplifier of significantly small proportions.

The novel features which are considered characteristic of the invention are set forth with particularity in the appended claims. The invention itself, however, with respect to both its organization and method of operation, as well as additional objects and advantages thereof, will best be understood from the accompanying specifications and drawings.

*Description of the preferred embodiments*

In designing a feedback amplifier, in order to avoid oscillation, the use of large amounts of negative feedback places stringent requirements on the amplifier gain and phase characteristics. The required stability margin may be obtained by the appropriate shaping of the loop transmission characteristic AB (where A=open loop gain, B=feedback ratio). It is not necessary to specifically consider the phase characteristics since the phase shift AB is determined by the amplitude characteristics of AB. To insure a stable amplifier, the phase shift must be less than 180° at all frequencies for the loop transmission $AB \geq 1$.

Figure 1:
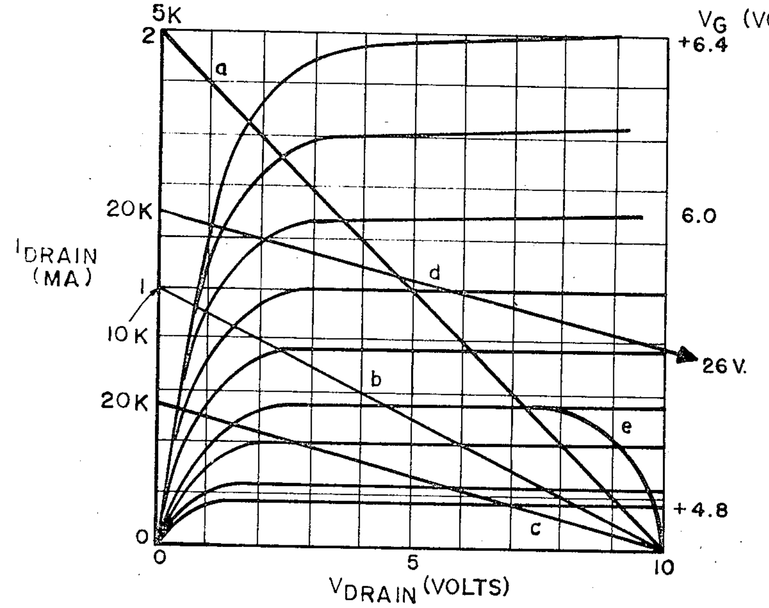
FIG. 1 is a series of characteristic curves for a typical thin film field effect device.

Referring now to the drawings wherein like reference characters designate like or corresponding parts throughout the several figures, there is shown in FIG. 1 a typical characteristic curve of a thin film transistor. The device characteristics of thin film transistors are very similar to those of vacuum tube pentodes.

The voltage gain of a single stage, assuming $$R_L \angle\angle rd$$

may be approximated by $g_m R_L$. The several load lines drawn on FIG. 1 illustrate that in most instances where the load is increased, the potential increase in gain is compensated for by decreases in transconductance. For instance, where the load is increased from 10K ohms (curve *b*) to 20K ohms (curve *c*) while maintaining a constant voltage, there is little, if any, increase in voltage gain. If, however, the supply voltage is increased, as shown for the upper 20K ohm load line (curve *d*), an increase in gain results. Where supply voltages are limited, it is desirable to use a load line of the type shown by curve *e*, where an apparent high impedance load is obtained over a portion of the operating range, but where only a low supply voltage is required.

Figure 2:
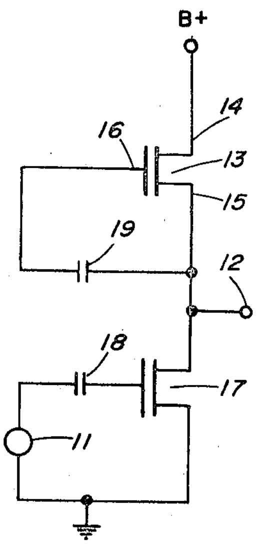
FIG. 2 is a simplified schematic circuit diagram of a thin film voltage amplification stage.

One method of obtaining such a load is illustrated by the circuit in FIG. 2, where 11 represents any typical A.C. supply voltage, and 12 is the output to the system. Elements 13 and 17 are thin film transistors having the characteristics shown in FIG. 1. Thin film transistors 13, 17 include a drain, a source, and a gate as indicated by reference numerals 14, 15, and 16 applied to transistor 13. Capacitors 18 and 19 are thin film capacitors.

Referring to the arrangement of thin film transistors 13 and 17, it can be seen that one device acts as the load for the other. This is commonly referred to as a modified cascode operation. The amplification of such a stage, where $R_d$ equals $R_L$, is $$\frac{R_L}{R_d+R_L}=\frac{\mu}{2}$$

Large gains have been measured using this configuration.

Unfortunately, D.C. instability is such that the simple circuit of FIG. 2 cannot be used. Small variations in device parameters cause shift in the operating point to a non-linear region.

Figure 3:
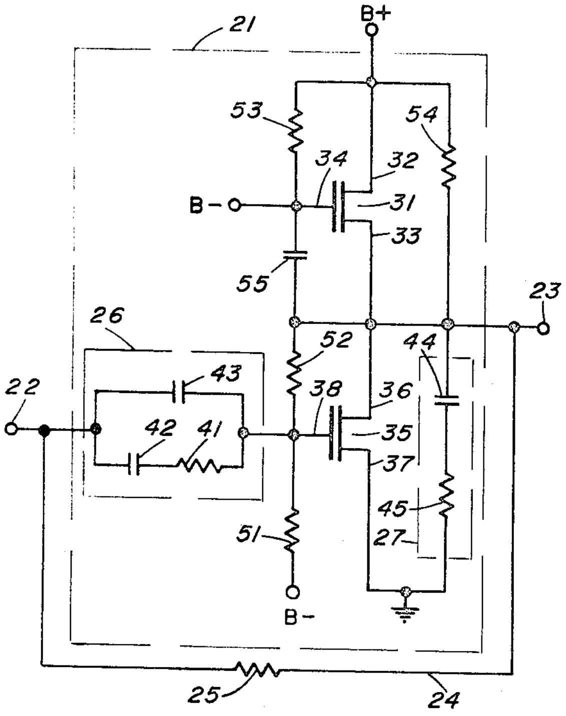
FIG. 3 is a schematic diagram of a cascode single stage thin film amplifier embodying the invention.

The configuration of FIG. 3 alleviates the problem of non-stability inherent in the system of FIG. 2. The amplifier in FIG. 3 consists of an input 22, an amplification stage 21, an output 23 and the feedback path 24 which includes feedback resistor 25. Amplification stage 21 consists of two thin film transistors 31 and 35 connected in a modified cascode relationship. A typical cascode connection for two transistors occurs where there is a grounded source amplifier followed by a grounded gate amplifier. In the modified cascode arrangement of the instant case, transistor 35 is a grounded source amplifier while transistor 31 is a constant current A.C. load. For D.C., transistor 31 acts as a low impedance source. Thin film field effect transistor 31 has a drain 32, a source 33 and a gate 34. Likewise, thin film field effect transistor 35 has a drain 36, source 37, and gate 38. D.C. stability is provided in the system by biasing resistance 51, 52, 53 and 54 and a coupling capacitor 55. Both the resistors and the capacitor are preferably of the thin film variety. Element 26 connected between the input 22 and gate 38 of thin film field effect transistor 35 is a low frequency filter. Element 27, connected to hte output of the system, comprises a high frequency filter. Resistor 41 and capacitors 42 and 43 of low frequency filter 26 are of the thin film variety as are resistor 45 and capacitor 44 of the high frequency filter 27. The filters function to provide the necessary feedback in order to insure frequency stability.

Figure 4:
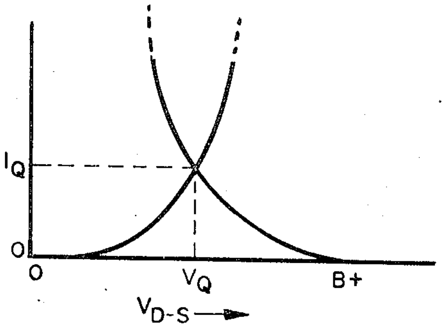
FIG. 4 is the DC characteristic curve, with load, of the embodiment in FIG. 3.

FIG. 4 shows the approximate D.C. characteristics of the amplifier stage depicted in FIG. 2. A small shift in either of the curves due to temperature or inherent device instability will cause only a minor shift in the operating point voltage $V_q$. The low frequency response of the stage is governed by the RC time constant of the low frequency filter, or coupling network, 26. For low frequency response, it is necessary that coupling biasing resistor 52 must be of a large value due to the Miller effect (i.e., the input capacity of a common source amplifier stage is enhanced by the product of the stage voltage gain and the gate to drain capacitance). The high frequency response of the stage is limited by the thin film transistor gain bandwidth product (the product of load resistance and input capacitance) which, for a given gain, limits the frequency response.

Figure 5:
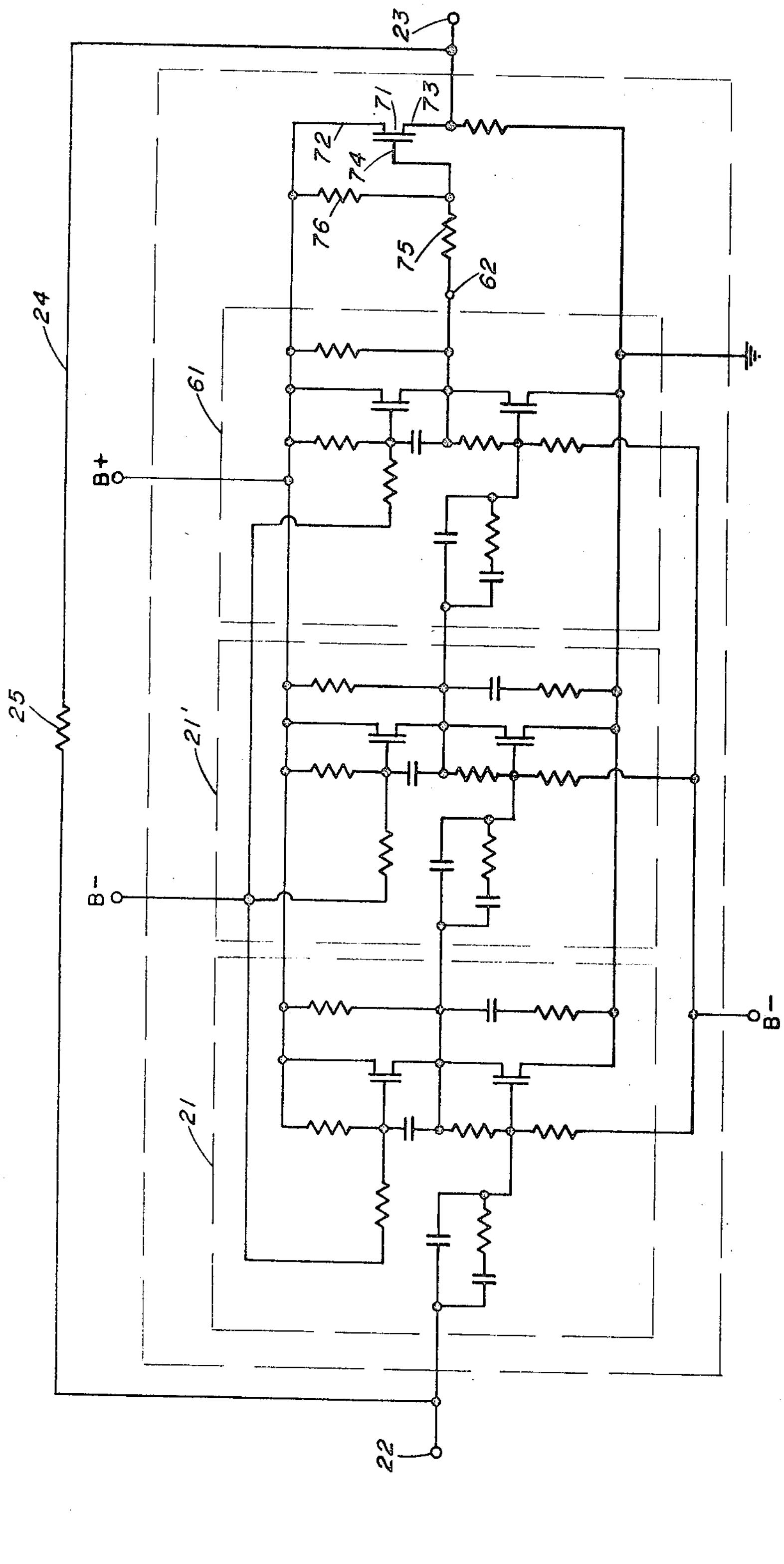
FIG. 5 is a schematic circuit diagram of a multi-stage high gain monotronic amplifier further embodying the invention.

FIG. 5 is a diagram of a high gain A.C. operational monotronic summing amplifier. Three stages, 21, 21' and 61, of the type shown in FIG. 3, have been cascaded in the normal manner. While FIG. 5 discloses only three stages, it will be obvious to one skilled in the art that any odd number of stages can also be employed. All stages are identical except for the final stage 61 which does not include high frequency filter 27. The output 62 of the final stage 61 is coupled through biasing resistors 75 and 76 to thin film filed effect transistor 71 which acts as the load for the amplifier. Feedback loop 24 and feedback resistor 25 provide the necessary negative feedback path to insure stablity of the operational amplifier.

The maximum open loop gain achievable with the amplifier in FIG. 5 is a function of the combined three stage, high frequency cut-off characteristic.

Figure 6:
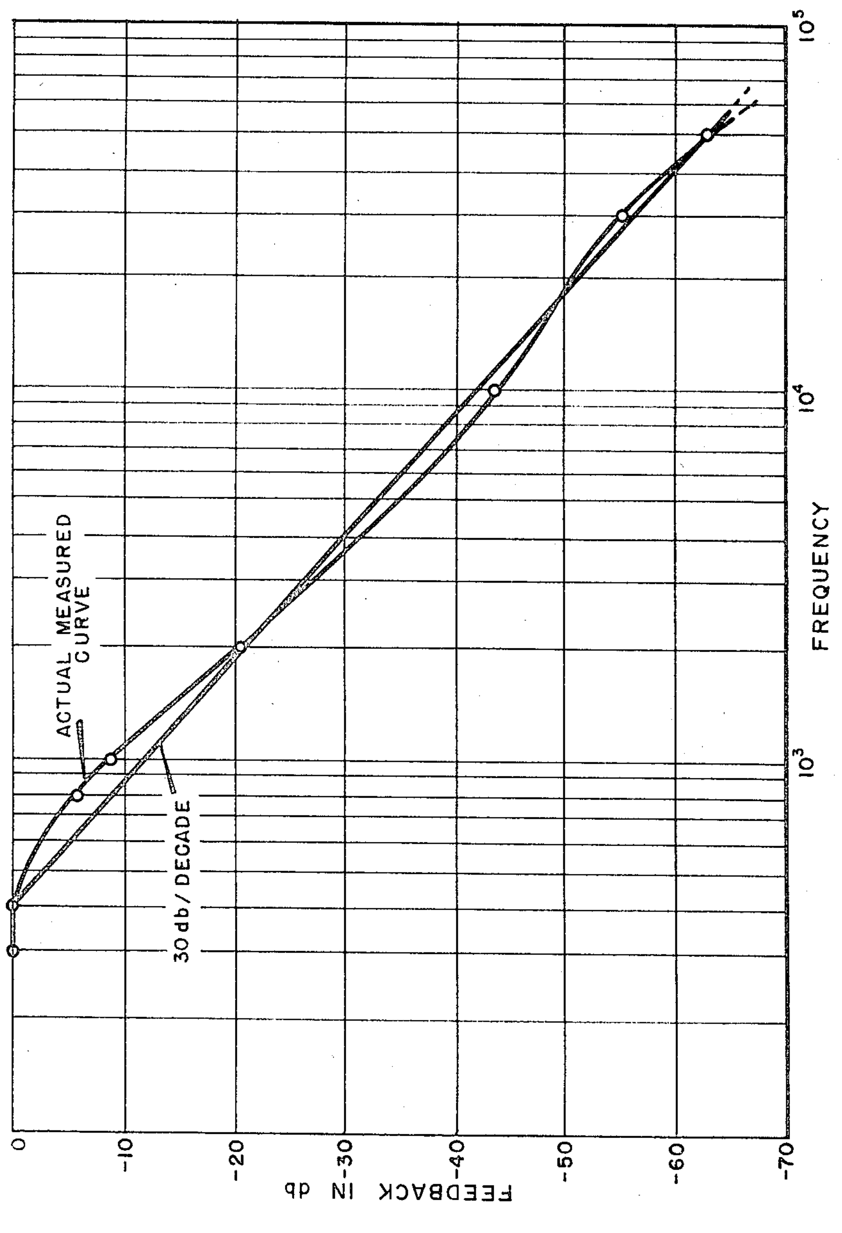
FIG. 6 illustrates operation of the amplifier of FIG. 5.

The curve of FIG. 6 represents the performance of the amplifier shown in FIG. 5. Except for corrections to the shape of the curve at lower frequencies, this response represents very closely the maximum performance attainable for an amplifier using thin film transistors.

It will be appreciated by the skilled practitioner that while a monotronic amplifier has been disclosed, equivalent results, except for size, could be achieved using conventional passive components and field effect transistors. It will be further appreciated by the skilled practitioner that while a three stage summing amplifier has been disclosed, any odd number of stages could be employed. However, it has been found that the most ideal results occur when three stages are utilized. Therefore, the scope of the invention is not to be limited by the specific embodiment described above.

What is claimed is:

1. An electrical circuit comprising:

a first and a second semi-conductor thin film field effect device connected in a modified cascode relationship, each having a gate, a source and a drain;

D.C. stabilizing means connected to said semi-conductor thin film field effect devices comprising biasing means connected to the gate of each of said semi-conductor thin film field effect devices;

input means connected to said stabilizing means;

passive element high frequency responsive output means connected across the drain and source of said second semi-conductor thin film field effect device;

passive element low frequency filter means connected to the gate of said second semi-conductor thin film field effect device;

an output terminal connected to said output means, said output terminal being connected to said output means, said output terminal being connected to the junction formed by the source of said first semi-conductor thin film field effect device and the drain of said second semi-conductor thin film field effect device and to the high frequency responsive means; and feedback means connected from said output terminal to said input means.

2. An electrical circuit according to claim 1 wherein:

said low frequency filter means comprises a first thin film resistor connected in series with a thin film capacitor, and a second thin film capacitor connected in parallel with the series combination of said first resistor and said capacitor.

3. An electrical circuit according to claim 2 wherein:

said high frequency responsive means comprises a thin film resistor connected in series with a thin film capacitor.

4. A monotronic amplifier comprising:

2N—1 cascaded stages of amplifiation, where N represents any positive integer, each comprising:

an input means, a first and second semi-conductor thin film field effect device connected in a modified cascode relationship, each having a gate, a source, and a drain, output means connected to the junction formed by the source of said first semi-conductor thin film field effect device and the drain of said second-conductor thin film field effect device, D.C. stabilizing means connected between said input means and said semi-conductor thin film field effect devices;

an input terminal connected to the input means of the first stage of amplification;

high frequency responsive means connecting the output means of each stage of amplification to the input means of the next stage of amplification;

load means connected to the output means of the final stage of amplification;

an output terminal connected to said load means; and wherein said amplifier further contains feedback means connected from said output terminal to said input terminal.

5. A monotronic operational amplifier according to claim 4 wherein in each amplification stage said two semi-conductor thin film field effect devices each have a gate, a source and a drain;

said D.C. stabilizing means comprises biasing means connected to the gate of each of said semi-conductor thin film field effect devices; and wherein there is further provided low frequency filter means connected between said input means and the gate of said second semi-conductor thin film field effect device.

6. A monotronic operational amplifier according to claim 5 wherein:

said low frequency filter means comprises a first thin film resistor connected in series with a thin film capacitor, and a second thin film capacitor connected in parallel with the series combination of said first resistor and said capacitor; and said high frequency responsive means comprises a third thin film resistor connected in series wih a second thin film capacitor, the series combination being connected across the second semi-conductor thin film field effect device.

7. A monotronic operational amplifier according to claim 6 wherein N is equal to two.

References Cited

UNITED STATES PATENTS

| | | | |
|---|---|---|---|
| 3,070,762 | 12/1962 | Evans. | |
| 3,286,189 | 11/1966 | Mitchell et al. | |
| 3,289,093 | 11/1966 | Wanlass. | |
| 3,296,546 | 1/1967 | Schneider | 330—21 |

OTHER REFERENCES

Minton et al.: "A Ten-Watt High-Quality Transistorized Audio Power Amplifier," IRE Student Quarterly, February 1958, pp. 19–24.

ROY LAKE, *Primary Examiner.*

J. B. MULLINS, *Assistant Examiner.*

U.S. Cl. X.R.

330—28, 35, 38